(12) United States Patent
Yang

(10) Patent No.: US 8,178,963 B2
(45) Date of Patent: May 15, 2012

(54) WAFER LEVEL PACKAGE WITH DIE RECEIVING THROUGH-HOLE AND METHOD OF THE SAME

(75) Inventor: Wen-Kun Yang, Hsin-Chu (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 875 days.

(21) Appl. No.: 11/648,688

(22) Filed: Jan. 3, 2007

(65) Prior Publication Data

US 2008/0157336 A1    Jul. 3, 2008

(51) Int. Cl.
*H01L 23/52* (2006.01)
(52) U.S. Cl. ........ 257/691; 257/690; 257/698; 257/729; 257/E23.141; 257/678
(58) Field of Classification Search .................. 257/678, 257/691, 690, 698, 729, E23.141
See application file for complete search history.

(56) References Cited

U.S. PATENT DOCUMENTS

| | | | | |
|---|---|---|---|---|
| 5,208,478 A | * | 5/1993 | Solomon | 257/443 |
| 6,127,634 A | * | 10/2000 | Higashiguchi et al. | 174/262 |
| 6,952,049 B1 | * | 10/2005 | Ogawa et al. | 257/700 |
| 2007/0096292 A1 | * | 5/2007 | Machida | 257/700 |

* cited by examiner

*Primary Examiner* — Marcos D. Pizarro
*Assistant Examiner* — Eva Yan Montalvo
(74) *Attorney, Agent, or Firm* — Kusner & Jaffe

(57) ABSTRACT

The present invention discloses a structure of package comprising: a substrate with a die receiving through hole, a connecting through hole structure and a first contact pad; a die disposed within the die receiving through hole; a surrounding material formed under the die and filled in the gap between the die and sidewall of the die receiving though hole; a dielectric layer formed on the die and the substrate; a re-distribution layer (RDL) formed on the dielectric layer and coupled to the first contact pad; a protection layer formed over the RDL; and a second contact pad formed at the lower surface of the substrate and under the connecting through hole structure.

8 Claims, 5 Drawing Sheets

Panel wafer form before RDL build up layers process

Pre-formed substrate with die through holes

WAFER LEVEL PACKAGE WITH DIE RECEIVING THROUGH-HOLE AND METHOD OF THE SAME

FIELD OF THE INVENTION

This invention relates to a structure of wafer level package (WLP), and more particularly to a fan-out wafer level package with die receiving through-hole formed within the substrate to improve the reliability and to reduce the device size.

DESCRIPTION OF THE PRIOR ART

In the field of semiconductor devices, the device density is increased and the device dimension is reduced, continuously. The demand for the packaging or interconnecting techniques in such high density devices is also increased to fit the situation mentioned above. Conventionally, in the flip-chip attachment method, an array of solder bumps is formed on the surface of the die. The formation of the solder bumps may be carried out by using a solder composite material through a solder mask for producing a desired pattern of solder bumps. The function of chip package includes power distribution, signal distribution, heat dissipation, protection and support . . . and so on. As a semiconductor become more complicated, the traditional package technique, for example lead frame package, flex package, rigid package technique, can't meet the demand of producing smaller chip with high density elements on the chip.

Furthermore, because conventional package technologies have to divide a dice on a wafer into respective dies and then package the die respectively, therefore, these techniques are time consuming for manufacturing process. Since the chip package technique is highly influenced by the development of integrated circuits, therefore, as the size of electronics has become demanding, so does the package technique. For the reasons mentioned above, the trend of package technique is toward ball grid array (BGA), flip chip ball grid array (FC-BGA), chip scale package (CSP), Wafer level package (WLP) today. "Wafer level package" is to be understood as meaning that the entire packaging and all the interconnections on the wafer as well as other processing steps are carried out before the singulation (dicing) into chips (dies). Generally, after completion of all assembling processes or packaging processes, individual semiconductor packages are separated from a wafer having a plurality of semiconductor dies. The wafer level package has extremely small dimensions combined with extremely good electrical properties.

WLP technique is an advanced packaging technology, by which the die are manufactured and tested on the wafer, and then the wafer is singulated by dicing for assembly in a surface-mount line. Because the wafer level package technique utilizes the whole wafer as one object, not utilizing a single chip or die, therefore, before performing a scribing process, packaging and testing has been accomplished; furthermore, WLP is such an advanced technique so that the process of wire bonding, die mount and under-fill can be omitted. By utilizing WLP technique, the cost and manufacturing time can be reduced, and the resulting structure of WLP can be equal to the die; therefore, this technique can meet the demands of miniaturization of electronic devices.

Though the advantages of WLP technique mentioned above, some issues still exist influencing the acceptance of WLP technique. For instance, the CTE difference (mismatching) between the materials of a structure of WLP and the mother board (PCB) becomes another critical factor to mechanical instability of the structure. A package scheme disclosed by Patent Number U.S. Pat. No. 6,271,469 suffers the CTE mismatching issue. It is because the prior art uses silicon die encapsulated by molding compound. As known, the CTE of silicon material is 2.3, but the CTE of molding compound is around 40-80. The arrangement causes chip location be shifted during process due to the curing temperature of compound and dielectric layers materials are higher and the inter-connecting pads will be shifted that will causes yield and performance problem. It is difficult to return the original location during temperature cycling (it caused by the epoxy resin property if the curing Temp near/over the Tg). It means that the prior structure package can not be processed by large size, and it causes higher manufacturing cost.

Further, some technical involves the usage of die that directly formed on the upper surface of the substrate. As known, the pads of the semiconductor die will be redistributed through redistribution processes involving a redistribution layer (RDL) into a plurality of metal pads in an area array type. The build up layer will increase the size of the package. Therefore, the thickness of the package is increased. This may conflict with the demand of reducing the size of a chip.

Further, the prior art suffers complicated process to form the "Panel" type package. It needs the mold tool for encapsulation and the injection of mold material. It is unlikely to control the surface of die and compound at same level due to warp after heat curing the compound, the CMP process may be needed to polish the uneven surface. The cost is therefore increased.

Therefore, the present invention provides a fan-out wafer level packaging (FO-WLP) structure with good CTE performance and shrinkage size to overcome the aforementioned problem and also provide the better board level reliability test of temperature cycling.

SUMMARY OF THE INVENTION

The object of the present invention is to provide a fan-out WLP with excellent CTE performance and shrinkage size.

The further object of the present invention is to provide a fan-out WLP with a substrate having die receiving through-hole for improving the reliability and shrinking the device size.

The present invention discloses a structure of package comprising: a substrate with a die receiving through hole, a connecting through hole structure and a first contact pad; a die disposed within the die receiving through hole; a surrounding material formed under the die and filled in the gap between the die and sidewall of the die receiving though hole; a dielectric layer formed on the die and the substrate; a re-distribution layer (RDL) formed on the dielectric layer and coupled to the first contact pad; a protection layer formed over the RDL; and a second contact pad formed at the lower surface of the substrate and under the connecting through hole structure.

The material of the substrate includes epoxy type FR5, FR4, BT, silicon, PCB (print circuit board) material, glass or ceramic. Alternatively, the material of the substrate includes alloy or metal; it prefers that the CTE (Coefficient of Thermal Expansion) of the substrate is close to the CTE of mother board (PCB) having CTE around 16 to 20. The material of the dielectric layer includes an elastic dielectric layer, a photosensitive layer, a silicone dielectric based layer, a siloxane polymer (SINR) layer, a polyimides (PI) layer or silicone resin layer.

DESCRIPTION OF THE PREFERRED EMBODIMENT

The invention will now be described in greater detail with preferred embodiments of the invention and illustrations attached. Nevertheless, it should be recognized that the preferred embodiments of the invention is only for illustrating. Besides the preferred embodiment mentioned here, present invention can be practiced in a wide range of other embodiments besides those explicitly described, and the scope of the present invention is expressly not limited expect as specified in the accompanying claims.

The present invention discloses a structure of fan-out WLP utilizing a substrate having predetermined terminal contact metal pads 3 formed thereon and a pre-formed die receiving through hole 4 formed into the substrate 2. A die is disposed within the die receiving through hole of the substrate and attached on core paste material, for example, an elastic core paste material is filled into the space between die edge and side wall of die receiving through hole of the substrate and/or under the die. A photosensitive material is coated over the die and the pre-formed substrate (includes the core paste area). Preferably, the material of the photosensitive material is formed of elastic material.

Figure 1:
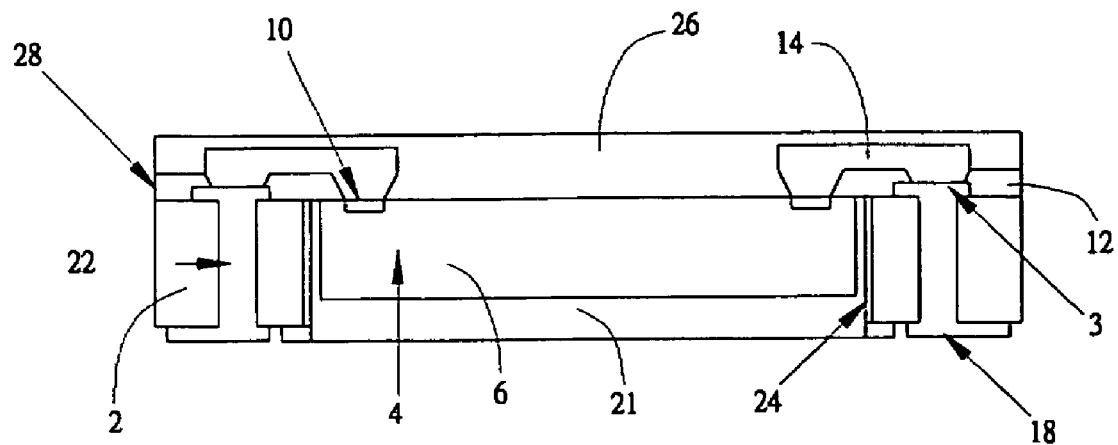
FIG. 1 illustrates a cross-sectional view of a structure of fan-out WLP (LGA type) according to the present invention.

FIG. 1 illustrates a cross-sectional view of Fan-Out Wafer Level Package (FO-WLP) in accordance with one embodiment of the present invention. As shown in the FIG. 1, the structure of FO-WLP includes a substrate 2 having a terminal contact metal pads 3 (for organic substrate) and die receiving through holes 4 formed therein to receive a die 6. The die receiving through holes 4 is formed from the upper surface of the substrate through the substrate to the lower surface. The through hole 4 is pre-formed within the substrate 2. The core material 21 is coated under the lower surface of the die 6, thereby sealing the die 6. The core paste 21 is also refilled within the space between the die edge 6 and the sidewalls of the through holes 4. A conductive layer 24 is coated on the sidewall of the die receiving through holes 4 for better adhesion between silicon die and substrate by core material 21.

The die 6 is disposed within the die receiving through holes 4 on the substrate 2. As know, contact pads (Bonding pads) 10 are formed on the die 6. A photosensitive layer or dielectric layer 12 is formed over the die 6 and the upper surface of substrate. Pluralities of openings are formed within the dielectric layer 12 through the lithography process or exposure and develop procedure. The pluralities of openings are aligned to the contact pads or I/O pads 10 and first terminal contact metal pads 3 on the upper surface of the substrate, respectively. The RDL (redistribution layer) 14, also referred to as conductive trace 14, is formed on the dielectric layer 12 by removing (seed layers) selected portions of metal layer formed over the layer 12, wherein the RDL 14 keeps electrically connected with the die 6 through the I/O pads 10 and first terminal contact metal pads 3. The substrate further comprises connecting through holes 22 formed within the substrate 2. The first terminal contact metal pads 3 are formed over the connecting through holes 22. The conductive material is re-filled into the connecting through holes 22 for electrical connection (pre-formed substrate). Second terminal pads 18 are located at the lower surface of the substrate 2 and under the connecting through holes 22 and connected to the first contact metal pads 3 of the substrate. A scribe line 28 is defined between the package units for separating each unit, optionally, there is no dielectric layer over the scribe line. A protection layer 26 is employed to cover the RDL 14. The multi build up layers (RDLs) are easy to be processed by repeating the aforementioned steps.

The dielectric layer and the core material act as buffer area that absorbs the thermal mechanical stress between the die 6 and substrate 2 during temperature cycling due to the dielectric layer 12 and core materials have elastic properties. The aforementioned structure constructs LGA type package.

Figure 2:
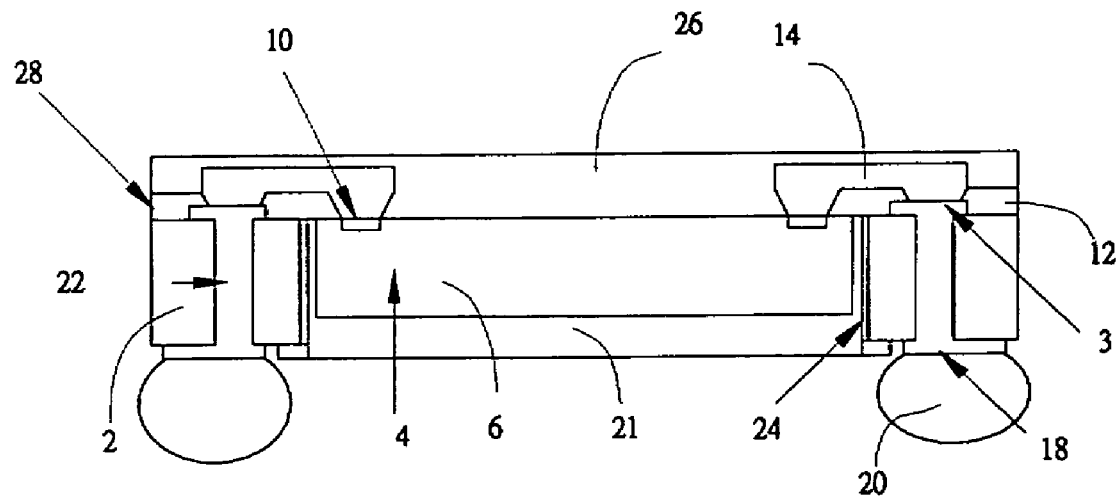
FIG. 2 illustrates a cross-sectional view of a structure of fan-out WLP (BGA type) according to the present invention.

An alternative embodiment can be seen in FIG. 2, conductive balls 20 are formed on the second terminal pads 18. This type is called BGA type. The other parts are similar to FIG. 1, therefore, the detailed description is omitted. The terminal pads 18 may act as the UBM (under ball metal) under the BGA scheme in the case. Pluralities of contact conductive pads 3 are formed on the upper surface of the substrate 2 and under the RDL 14.

Preferably, the material of the substrate 2 is organic substrate likes epoxy type FR5, BT, PCB with defined through holes or Cu metal with pre etching circuit. Preferably, the CTE is the same as the one of the mother board (PCB). Preferably, the organic substrate with high Glass transition temperature (Tg) are epoxy type FR5 or BT (Bismaleimide triazine) type substrate. The Cu metal (CTE around 16) can be used also. The glass, ceramic, silicon can be used as the substrate. The elastic core paste is formed of silicone rubber elastic materials.

It is because that the CTE (X/Y direction) of the epoxy type organic substrate (FR5/BT) is around 16 and the CTE of the tool for chip redistribution is around 5 to 8 by employing the glass materials as the tool. The FR5/BT is unlikely to return to original location after the temperature cycling (once the temperature is close to Glass transition temperature Tg) that causes the die shift in panel form during the WLP process which needs several high temperature process.

Figure 3:
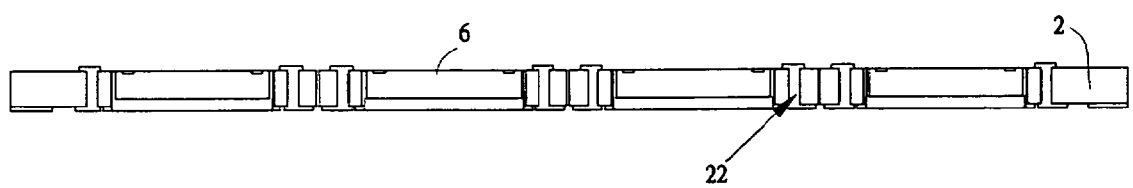
FIG. 3 illustrates a cross-sectional view of the substrate according to the present invention.
Figure 3:
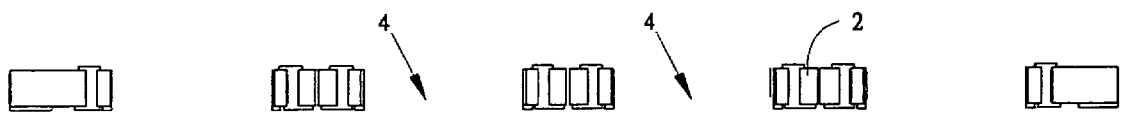

The substrate could be round type such as wafer type, the diameter could be 200, 300 mm or higher. It could be employed for rectangular type such as panel form. The substrate 2 is pre-formed with die receiving through holes 4. The scribe line 28 is defined between the units for separating each unit. Please refer to FIG. 3, it shows that the substrate 2 includes a plurality of pre-formed die receiving through hole 4 and the connecting through holes 22. Conductive material is re-filled into the connecting through holes (pre-formed), thereby constructing the connecting through hole 22 structures.

In one embodiment of the present invention, the dielectric layer 12 is preferably an elastic dielectric material which is made by silicone dielectric based materials comprising siloxane polymers (SINR), Dow Corning WL5000 series, and the combination thereof. In another embodiment, the dielectric layer is made by a material comprising, polyimides (PI) or silicone resin. Preferably, it is a photosensitive layer for simple process.

In one embodiment of the present invention, the elastic dielectric layer is a kind of material with CTE larger than 100 (ppm/□), elongation rate about 40 percent (preferably 30 percent-50 percent), and the hardness of the material is between plastic and rubber. The thickness of the elastic dielectric layer 18 depends on the stress accumulated in the RDL/dielectric layer interface during temperature cycling test.

Figure 4:
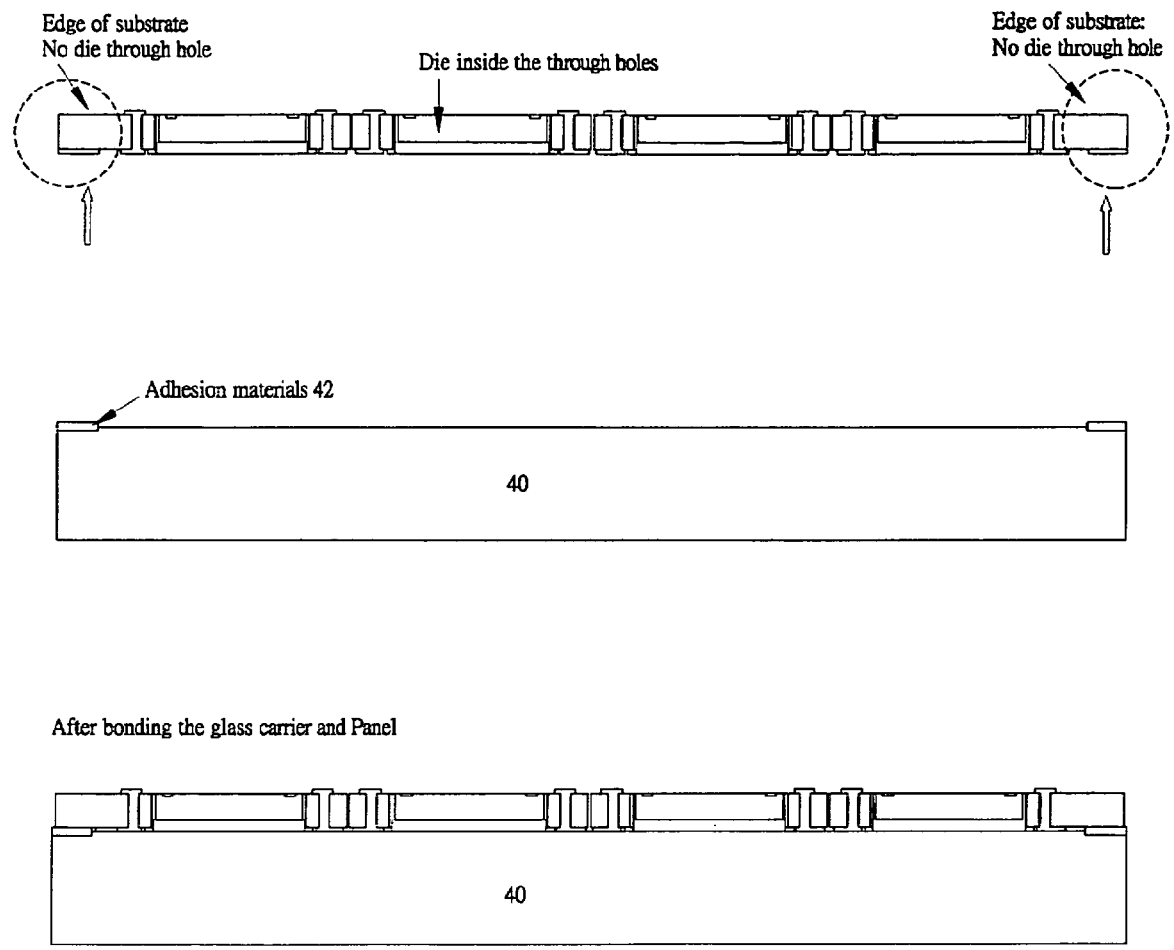
FIG. 4 illustrates a cross-sectional view of the combination of the substrate and the glass carrier according to the present invention.

FIG. 4 illustrate the glass carrier tool 40 for carrying the panel wafer (redistribution dies 6 and the substrate 2). Adhesion materials 42 such as UV curing type material are formed at the periphery area of the tool 40. In one case, the tool could be made of glass with the shape of panel form. The die receiving through holes structure will not be formed at the edge of the substrate. The lower portion of FIG. 4 illustrates the combination of the glass carrier tool and the panel (dies and substrate). The panel will be adhesion with the glass carrier, it will stick and hold the panel during process.

Figure 5:
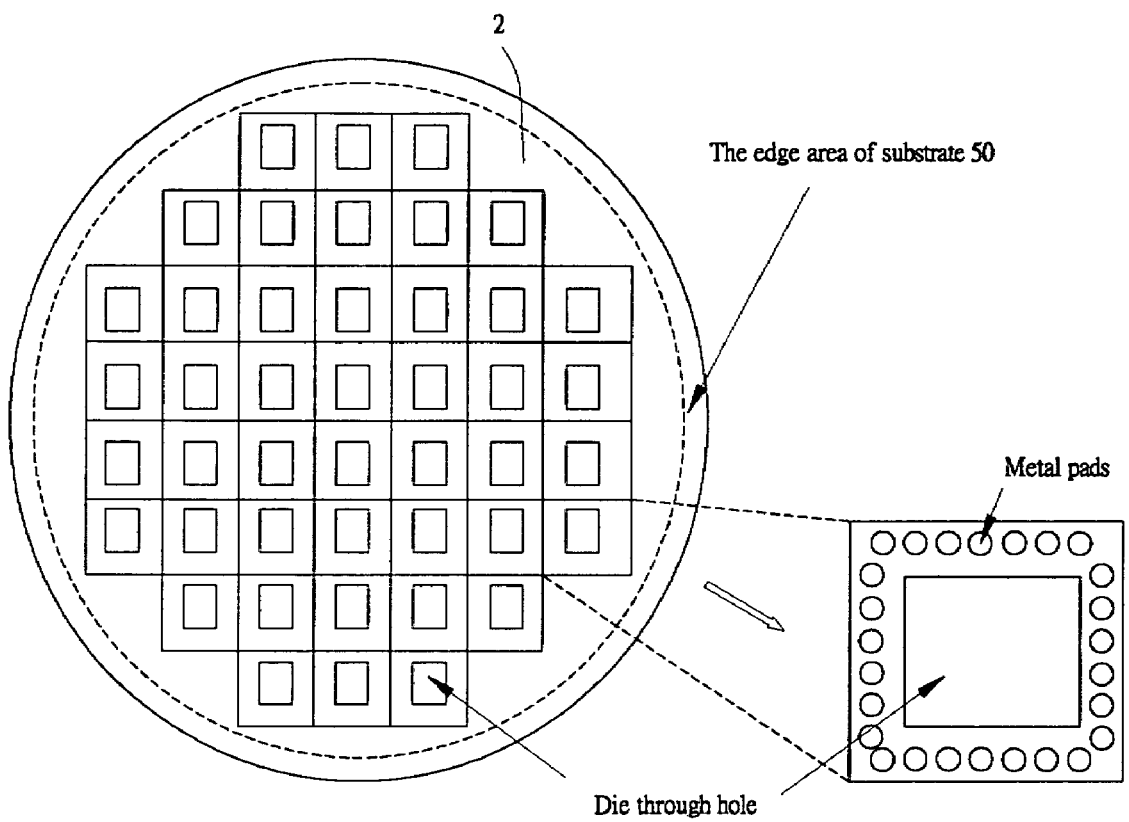
FIG. 5 illustrates a top view of the substrate according to the present invention.

FIG. 5 illustrates the top view of the substrate having die receiving through holes 4. The edge area 50 of substrate does not have the die receiving through holes, it is employed for sticking the glass carrier during WLP process. After the WLP process is completed, the substrate 2 will be cut along the dot line from the glass carrier, it means that the inside area of dot line will be processed by the sawing process for package singulation.

Figure 6:
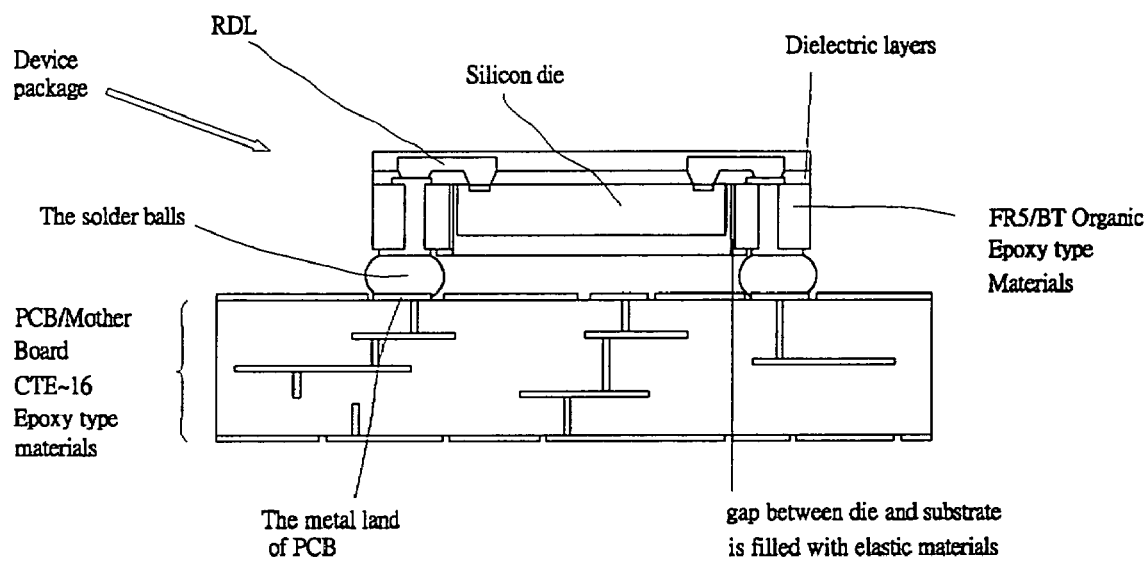
FIG. 6 illustrates a view of the semiconductor device Package on board level temperature cycling test according to the present invention.

Please refer to FIG. 6, it illustrates the major portions that associate with the CTE issue. The silicon die (CTE is ~2.3) is packaged inside the package. FR5 or BT organic epoxy type material (CTE~16) is employed as the substrate and its CTE is the same as the PCB or Mother Board. The space (gap) between the die and the substrate is filled with filling core material (prefer the elastic core paste) to absorb the thermal mechanical stress due to CTE mismatching (between die and the epoxy type FR5/BT). Further, the dielectric layers 12 include elastic materials to absorb the stress between the die pads and the PCB. The RDL metal is Cu/Au materials and the CTE is around 16 that is the same as the PCB and organic substrate, and the UBM 18 of contact bump be located on the terminal contact metal pads 3 of substrate. The metal land of PCB is Cu composition metal, the CTE of Cu is around 16 that is match to the one of PCB. From the description above, the present invention may provide excellent CTE (fully matching in X/Y direction) solution for the WLP.

Apparently, CTE matching issue under the build up layers (PCB and substrate) is solved by the present scheme and it provides better reliability (no thermal stress in X/Y directions for terminal pads (solder balls/bumps) on the substrate during on board level condition) and the elastic DL is employed to absorb the Z direction stress. The space (gap) between chip edge and sidewall of through holes of substrate can be used to fill the elastic dielectric materials to absorb the mechanical/thermal stress.

In one embodiment of the invention, the material of the RDL comprises Ti/Cu/Au alloy or Ti/Cu/Ni/Au alloy; the thickness of the RDL is between 2 um_and_5 um. The Ti/Cu alloy is formed by sputtering technique also as seed metal layers, and the Cu/Au or Cu/Ni/Au alloy is formed by electroplating; exploiting the electro-plating process to form the RDL can make the RDL thick enough and better mechanical properties to withstand CTE mismatching during temperature cycling. The metal pads can be Al or Cu or combination thereof. If the structure of FO-WLP utilizes SINR as the elastic dielectric layer and Cu as the RDL, according the stress analysis not shown here, the stress accumulated in the RDL/dielectric layer interface is reduced.

As shown in FIGS. 1-2, the RDLs fan out from the die and they communicate toward the second terminal pads downwardly. It is different from the prior art technology, the die 6 is received within the pre-formed die receiving through hole of the substrate, thereby reducing the thickness of the package. The prior art violates the rule to reduce the die package thickness. The package of the present invention will be thinner than the prior art. Further, the substrate is pre-prepared before package. The die receiving through hole 4 is pre-determined. Thus, the throughput will be improved than ever. The present invention discloses a fan-out WLP with reduced thickness and good CTE matching performance.

The present invention includes preparing a substrate (preferably organic substrate FR4/FR5/BT) and contact metal pads are formed on upper surface and metal connecting through holes to lower surface. The through hole is formed with the size larger than die size plus>100 um/side. The depth is the same with the thickness of dice thickness.

The RDL (trace 1, optional process) is formed on the processed silicon wafer, it can improves the yield during process if the pitch of I/O metal (bonding) pads is too tight (small) for photo lithography process. The next step is lapping the wafer by back-lapping to desired thickness. The wafer is introduced to dicing procedure to separate the dice.

Thereafter, process for the present invention includes providing a die redistribution (alignment) tool with alignment pattern formed thereon (preferably the glass material). Then, the patterned glues is printed on the tool (be used for sticking the surface of dice), followed by using pick and place fine alignment system with flip chip function to redistribute the desired dies on the tool with desired pitch. The patterned glues will stick the chips (active surface side) on the tool. Subsequently, the substrate (with die receiving through holes) is bound on the tool and followed by printing elastic core paste material on the space (gap) between die and side walls of through holes of the (FR5/BT) substrate and the die back side. It is preferred to keep the surface of the core paste and the substrate at the same level. Next, the curing process is used to cure the core paste material and bonding the glass carrier by UV curing. The panel bonder is used to bond the glass carrier on to the substrate and die back side. Vacuum curing is performed, followed by separating the tool from the panel wafer.

Once the die is redistributed on the substrate (panel base), then, a clean up procedure is performed to clean the dice surface by wet and/or dry clean. Next step is to coat the dielectric materials on the surface of panel. Subsequently, lithography process is performed to open via (contact metal pads) and Al bonding pads and/or the scribe line (optional). Plasma clean step is then executed to clean the surface of via holes and Al bonding pads. Next step is to sputter Ti/Cu as seed metal layers, and then Photo Resistor (PR) is coated over the dielectric layer and seed metal layers for forming the patterns of redistributed metal layers (RDL). Then, the electro plating is processed to form Cu/Au or Cu/Ni/Au as the RDL metal, followed by stripping the PR and metal wet etching to form the RDL metal trace. Subsequently, the next step is to coat or print the top dielectric layer and/or to open the scribe line (optional).

After the ball placement or solder paste printing on the lower side of panel, the heat re-flow procedure is performed to re-flow on the ball side (for BGA type). The metal layer is formed on the top dielectric layer for forming top marking. The testing is executed. Panel wafer level final testing is performed by using vertical probe card; the probing pads can be formed on the circuit side of die by opening the top dielectric layer on the pre-form contact metal pads. After the testing, the substrate is sawed to singular the package into individual units. Then, the packages are respectively picked and placed the package on the tray or tape and reel.

The advantages of the present inventions are:

The process is simple for forming Panel wafer type and is easy to control the roughness of panel surface. The thickness of panel (die attached) is easy to be controlled and die shift issue will be eliminated during process by glass carrier. The injection mold tool is omitted and warp, CMP polish process will not be introduced either. The panel wafer is easy to be processed by wafer level packaging process.

The substrate is pre-prepared with pre-form die receiving through holes and connecting metal through holes and terminal contact metal pads (for organic substrate); the size of die receiving through hole is equal to die size plus around>100 um per/side; it can be used as stress buffer releasing area by filling the elastic core paste materials to absorb the thermal stress due to the CTE between silicon die and substrate (FR5/BT)) is mismatching. The packaging throughput will be increased (manufacturing cycle time was reduced) due to apply the simple build up layers on top the surface of die. The terminal pads are formed on the same surface to the dice active surface.

The dice placement process is the same as the current process. Elastic core paste (resin, epoxy compound, silicone rubber, etc.) is refilled the space between the dice edge and the sidewall of the die receiving through holes for thermal stress releasing buffer in the present invention, then, vacuum heat curing is applied. CTE mismatching issue is overcome during panel form process (using the glass carrier with lower CTE that close to silicon die). Only silicone dielectric material (preferably SINR) is coated on the active surface and the substrate (preferably FR45 or BT) surface. The contact pads are opened by using photo mask process only due to the dielectric layer (SINR) is photosensitive layer for opening the contacting open. The die attached material is printed on the back-side of dice and substrate be bonded together with dies. The reliability for both package and board level is better than ever, especially, for the board level temperature cycling test, it was due to the CTE of substrate and PCB mother board are identical, hence, no thermal mechanical stress be applied on the solder bumps/balls; the previous failure mode (solder ball crack) during temperature cycling on board test were not obvious. The cost is low and the process is simple. It is easy to form the multi-chips package as well.

Although preferred embodiments of the present invention have been described, it will be understood by those skilled in the art that the present invention should not be limited to the described preferred embodiments. Rather, various changes and modifications can be made within the spirit and scope of the present invention, as defined by the following claims.

What is claimed is:

1. A structure of semiconductor device package comprising:
   a substrate with a die receiving through hole, a connecting through hole structure and a first contact pad, wherein said first contact pad is formed over said connecting through hole structure, and wherein the material of said substrate includes epoxy type FR5 or FR4;
   a die disposed within said die receiving through hole;
   a surrounding material formed under said die and filled in the gap between said die and sidewall of said die receiving though hole;
   a dielectric layer formed on said die and said substrate;
   a re-distribution layer (RDL) formed on said dielectric layer, wherein said RDL directly couples bonding pads of said die to said first contact pad over said connecting through hole structure;
   a protection layer formed over said RDL; and
   a second contact pad formed at the lower surface of said substrate and under said connecting through hole structure.

2. The structure of claim 1, further comprising conductive bumps coupled to said second contact pad.

3. The structure of claim 1, wherein said RDL comprises Ti/Cu/Au alloy or Ti/Cu/Ni/Au alloy.

4. The structure of claim 1, wherein the material of said substrate further includes bismaleimide triazine (BT), silicon, PCB (print circuit board) material, glass or ceramic.

5. The structure of claim 1, wherein the material of said substrate further includes alloy or metal.

6. The structure of claim 1, wherein said surrounding material includes elastic core paste material.

7. The structure of claim 1, further comprising a conductive layer on sidewall of said die receiving through hole.

8. The structure of claim 1, wherein said dielectric layer includes an elastic dielectric layer, a photosensitive layer, a silicone dielectric based layer, a siloxane polymer (SINR) layer, a polyimides (PI) layer or silicone resin layer.

* * * * *